(12) United States Patent
Yasui et al.

(10) Patent No.: US 11,869,748 B2
(45) Date of Patent: Jan. 9, 2024

(54) SUBSTRATE PROCESSING APPARATUS AND METHOD OF MANUFACTURING SEMICONDUCTOR DEVICE

(71) Applicant: Kokusai Electric Corporation, Tokyo (JP)

(72) Inventors: Takeshi Yasui, Toyama (JP); Katsunori Funaki, Toyama (JP); Yasutoshi Tsubota, Toyama (JP); Koichiro Harada, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 781 days.

(21) Appl. No.: 17/014,684

(22) Filed: Sep. 8, 2020

(65) Prior Publication Data

US 2020/0402774 A1   Dec. 24, 2020

Related U.S. Application Data

(63) Continuation of application No. PCT/JP2018/011471, filed on Mar. 22, 2018.

(51) Int. Cl.
*H01J 37/32* (2006.01)
*C23C 14/00* (2006.01)
(Continued)

(52) U.S. Cl.
CPC ...... *H01J 37/321* (2013.01); *H01J 37/32697* (2013.01); *C23C 14/0068* (2013.01);
(Continued)

(58) Field of Classification Search
CPC ............... H01J 37/321; H01J 37/32697; H01J 37/3244; H01J 37/32504;
(Continued)

(56) References Cited

U.S. PATENT DOCUMENTS

| 2008/0283500 A1 | 11/2008 | Motokawa |
| 2013/0059415 A1 | 3/2013 | Kato et al. |
| 2014/0106573 A1 | 4/2014 | Terasaki et al. |
| 2015/0126044 A1* | 5/2015 | Kato ............... C23C 16/505 |
| | | 118/723 R |

(Continued)

FOREIGN PATENT DOCUMENTS

| JP | 09-55299 A | 2/1997 |
| JP | 11-185995 A | 7/1999 |

(Continued)

*Primary Examiner* — Abdullah A Riyami
*Assistant Examiner* — Syed M Kaiser
(74) *Attorney, Agent, or Firm* — Edell, Shapiro & Finnan, LLC

(57) ABSTRACT

Described herein is a technique capable of suppressing sputtering on an inner peripheral surface of a process vessel when a process gas is plasma-excited in the process vessel. According to one aspect thereof, a substrate processing apparatus includes: a process vessel accommodating a process chamber where a process gas is excited into plasma; a gas supplier supplying the process gas into the process chamber; a coil wound around an outer peripheral surface of the process vessel and spaced apart therefrom, wherein a high frequency power is supplied to the coil; and an electrostatic shield disposed between the outer peripheral surface and the coil, wherein the electrostatic shield includes: a partition extending in a circumferential direction to partition between a part of the coil and the outer peripheral surface; and an opening extending in the circumferential direction and opened between another part of the coil and the outer peripheral surface.

13 Claims, 8 Drawing Sheets

(51) Int. Cl.
*C23C 14/06* (2006.01)
*C23C 16/44* (2006.01)

(52) U.S. Cl.
CPC ...... *C23C 14/0641* (2013.01); *C23C 16/4401* (2013.01); *H01J 37/3244* (2013.01); *H01J 37/32504* (2013.01); *H01J 2237/0262* (2013.01)

(58) Field of Classification Search
CPC ......... H01J 2237/0262; H01J 37/32651; H01J 37/3211; H01J 37/32174; C23C 14/0068; C23C 14/0641; C23C 16/4401; H01L 21/02274; H01L 21/02315; H01L 21/0234; H01L 21/3065; H01L 21/67017
See application file for complete search history.

(56) References Cited

U.S. PATENT DOCUMENTS

| | | | | |
|---|---|---|---|---|
| 2015/0235813 | A1* | 8/2015 | Miura | C23C 16/4584 156/345.28 |
| 2015/0332895 | A1* | 11/2015 | Miura | C23C 16/45551 156/345.33 |
| 2017/0011891 | A1* | 1/2017 | Hammond, IV | H01J 37/321 |
| 2017/0287677 | A1* | 10/2017 | Kato | H01J 37/32715 |
| 2018/0277338 | A1* | 9/2018 | Fukada | C23C 16/45544 |

FOREIGN PATENT DOCUMENTS

| | | | | |
|---|---|---|---|---|
| JP | 2008-288437 | A | | 11/2008 |
| JP | 2011082227 | A | * | 4/2011 ........ H01J 37/32137 |
| JP | 2013-55243 | A | | 2/2013 |
| JP | 2014-36026 | A | | 2/2014 |
| JP | 2014-75362 | A | | 4/2014 |
| JP | 2014-75579 | A | | 4/2014 |
| KR | 101529498 | B1 | * | 9/2018 .......... H01J 37/3244 |

* cited by examiner

SUBSTRATE PROCESSING APPARATUS AND METHOD OF MANUFACTURING SEMICONDUCTOR DEVICE

CROSS REFERENCE TO RELATED APPLICATIONS

This application is a continuation of International Application No. PCT/JP2018/011471, filed on Mar. 22, 2018, the entire contents of which are hereby incorporated by reference.

TECHNICAL FIELD

The present disclosure relates to a substrate processing apparatus and a method of manufacturing a semiconductor device.

BACKGROUND

For example, according to related arts, when forming a pattern of a semiconductor device such as a flash memory and a logic circuit, a step of performing a modification process may be performed. For example, as the modification process, a process of nitriding a surface of the pattern formed on a substrate using a process gas excited into plasma may be performed. The modification process serves as a part of manufacturing processes of the semiconductor device.

By exciting the process gas into the plasma, reactive species such as radicals and ions and electrons may be generated in a process vessel when the substrate is processed. Due to an electric field formed by an electrode to which a high frequency power is applied, the ions generated in the process vessel may be accelerated and may collide with an inner peripheral surface of the process vessel to cause sputtering. When the inner peripheral surface of the process vessel is sputtered, components of materials constituting the inner peripheral surface may be released into the process vessel, and may enter a film to be processed formed on the substrate. As a result, a substrate processing such as the modification process may be affected.

SUMMARY

Described herein is a technique capable of suppressing the generation of sputtering on an inner peripheral surface of a process vessel when a process gas is excited into plasma in the process vessel.

According to one aspect of the technique of the present disclosure, there is provided a processing apparatus including: a process vessel in which a process chamber is provided, wherein a process gas is excited into plasma in the process chamber; a gas supplier configured to supply the process gas into the process chamber; a coil wound around an outer peripheral surface of the process vessel while being spaced apart from the outer peripheral surface, and wherein a high frequency power is supplied to the coil; and an electrostatic shield disposed between the outer peripheral surface of the process vessel and the coil, wherein the electrostatic shield includes: a partition extending in a circumferential direction of the coil and configured to partition between a part of the coil and the outer peripheral surface of the process vessel; and an opening extending in the circumferential direction of the coil and opened between another part of the coil and the outer peripheral surface of the process vessel.

DETAILED DESCRIPTION

Hereinafter, one or more embodiments (also simply referred to as "embodiments") according to the technique of the present disclosure will be described with reference to the drawings.

Embodiment

Hereinafter, an embodiment according to the technique of the present disclosure will be described with reference to the drawings.

Overall Configuration of Substrate Processing Apparatus

Hereinafter, an example of a substrate processing apparatus according to the present embodiment will be described with reference to FIGS. 1 through 8. In the figures, a direction indicated by an arrow H represents a height direction (a vertical direction) of the substrate processing apparatus, a direction indicated by an arrow W represents a width direction (a horizontal direction) of the substrate processing apparatus, and a direction indicated by an arrow D represents a depth direction (another horizontal direction) of the substrate processing apparatus.

Figure 1:
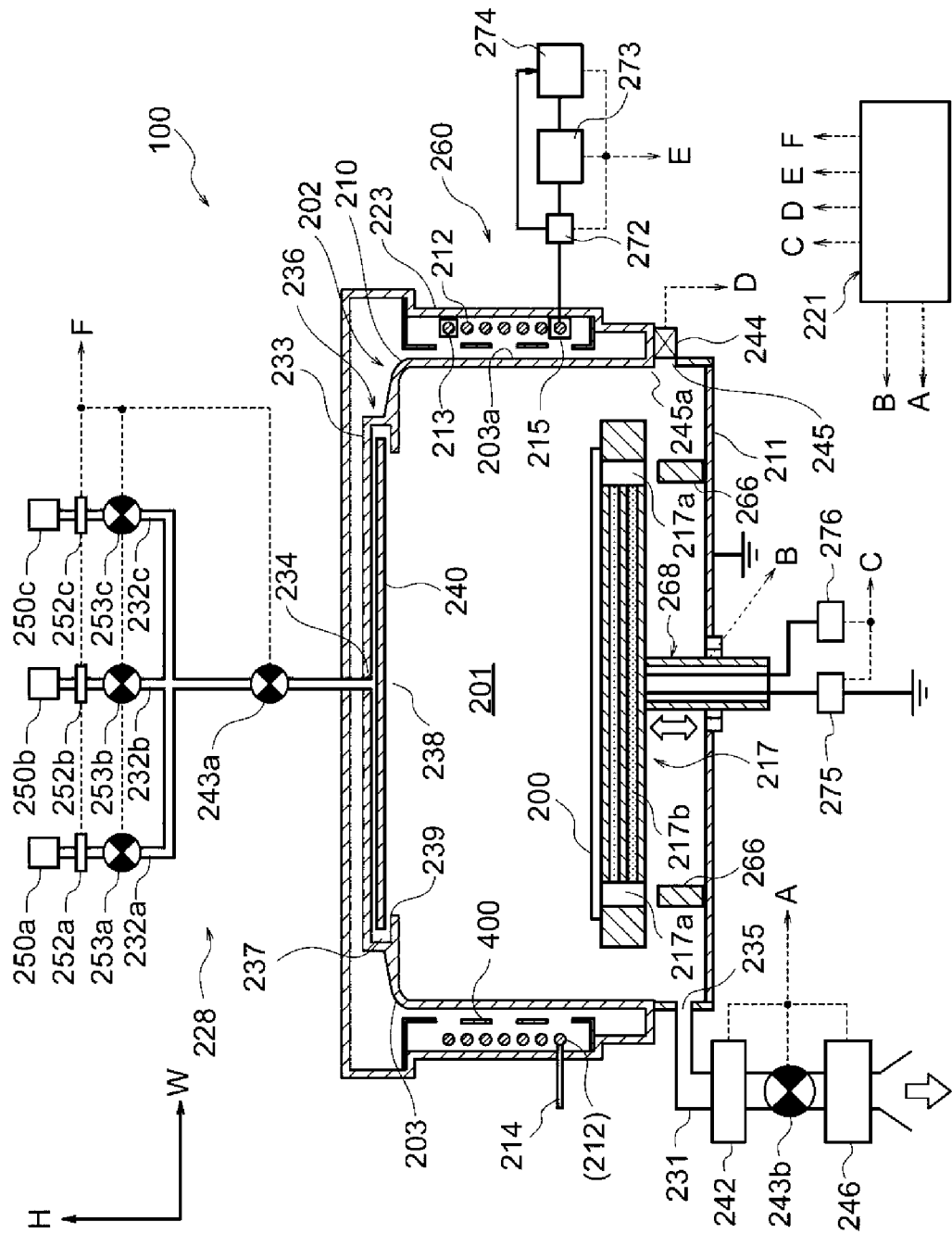
FIG. 1 schematically illustrates a vertical cross-section of a substrate processing apparatus according to one or more embodiments described herein.

For example, the substrate processing apparatus according to the present embodiment is configured to perform a substrate processing such as a nitridation process onto a film formed on a surface of a substrate. As shown in FIG. 1, a substrate processing apparatus 100 includes: a process furnace 202 configured to perform a plasma process; a susceptor 217 on which a wafer (which is the substrate) 200 is placed; a gas supplier (which is a gas supply system) 228 configured to supply a gas; a plasma generator 260 configured to generate plasma; and a controller 221 configured to control each component described above.

Process Furnace 202

As shown in FIG. 1, the process furnace 202 includes a process vessel 203 in which a process chamber 201 is provided. The process vessel 203 includes a dome-shaped upper vessel 210 and a bowl-shaped lower vessel 211.

The process chamber 201 whose horizontal cross-section is of a circular shape is provided in the process vessel 203. For example, the upper vessel 210 is made of a nonmetallic material such as aluminum oxide ($Al_2O_3$) and quartz ($SiO_2$), and the lower vessel 211 is made of a material such as aluminum (Al). According to the present embodiment, for example, the upper vessel 210 is made of quartz.

The process chamber 201 includes a plasma generation space where a resonance coil 212 described later is provided therearound and a substrate processing space where the wafer 200 is processed. The plasma generation space refers to a space where the plasma is generated, for example, a space above a lower end of the resonance coil 212 and below an upper end of the resonance coil 212 in the process chamber 201. The substrate processing space refers to a space where the wafer 200 is processed by the plasma, for example, a space below the lower end of the resonance coil 212.

A substrate loading/unloading port 245 is provided on a side wall of the lower vessel 211. A gate valve 244 is provided at the substrate loading/unloading port 245. While the gate valve 244 is open, the wafer 200 can be transferred (loaded) into the process chamber 201 through the substrate loading/unloading port 245 using a wafer transport device (not shown) or be transferred (unloaded) out of the process chamber 201 through the substrate loading/unloading port 245 using the wafer transport device. While the gate valve 244 is closed, the gate valve 244 maintains the process chamber 201 airtight.

A gas exhaust port 235 is provided at the side wall of the lower vessel 211. The gas such as a reactive gas (which is a process gas) is exhausted from the process chamber 201 through the gas exhaust port 235. An upstream end of a gas exhaust pipe 231 is connected to the gas exhaust port 235. An APC (Automatic Pressure Controller) valve 242 serving as a pressure regulator (pressure controller), a valve 243b serving as an opening/closing valve and a vacuum pump 246 serving as a vacuum exhauster are sequentially provided at the gas exhaust pipe 231 in that order from an upstream side to a downstream side of the gas exhaust pipe 231.

Susceptor 217

As shown in FIG. 1, the susceptor 217 serving as a substrate support is disposed at a lower portion of the process chamber 201. The wafer 200 can be placed on the susceptor 217. The susceptor 217 includes a heater 217b serving as a heating apparatus. When electric power is supplied to the heater 217b, the heater 217b is configured to heat the wafer 200 such that a surface temperature of the wafer 200 placed on the susceptor 217 may range, for example, from about 25° C. to about 750° C. The susceptor 217 is electrically insulated from the lower vessel 211.

The susceptor 217 further includes a variable impedance regulator 275 and a heater power regulator 276. The variable impedance regulator 275 is configured to improve a uniformity of a density of the plasma generated on the wafer 200 placed on the susceptor 217. The heater power regulator 276 is configured to adjust (regulate) the electric power supplied to the heater 217b.

Through-holes 217a are provided at the susceptor 217. Wafer lift pins 266 are disposed at a bottom of the lower vessel 211 corresponding to the through-holes 217a. A susceptor elevator 268 configured to elevate and lower the susceptor 217 is disposed below the susceptor 217. When the susceptor 217 is lowered by the susceptor elevator 268, the wafer lift pins 266 lift the wafer 200 from the susceptor 217. Thereby, the wafer 200 is out of contact with the susceptor 217.

Gas Supplier 228

As shown in FIG. 1, the gas supplier 228 includes a gas supply head 236, a nitrogen-containing gas supply pipe 232a, a hydrogen-containing gas supply pipe 232b, an inert gas supply pipe 232c, mass flow controllers (MFCs) 252a, 252b and 252c, and valves 253a, 253b, 253c and 243a.

The gas supply head 236 is disposed above the process chamber 201, that is, on an upper portion of the upper vessel 210. The gas supply head 236 includes a cap-shaped lid 233, a gas inlet port 234, a buffer chamber 237, an opening 238, a shield plate 240 and a gas outlet port 239.

A downstream end of the nitrogen-containing gas supply pipe 232a configured to supply nitrogen ($N_2$) gas serving as a nitrogen-containing gas, a downstream end of the hydrogen-containing gas supply pipe 232b configured to supply hydrogen ($H_2$) gas serving as a hydrogen-containing gas, a downstream end of the inert gas supply pipe 232c configured to supply argon (Ar) gas serving as an inert gas are connected to join the gas inlet port 234.

A nitrogen ($N_2$) gas supply source 250a, the mass flow controller (MFC) 252a serving as a flow rate controller and the valve 253a serving as an opening/closing valve are sequentially provided in that order from an upstream side to a downstream side of the nitrogen-containing gas supply pipe 232a. A hydrogen ($H_2$) gas supply source 250b, the MFC 252b and the valve 253b are sequentially provided in that order from an upstream side to a downstream side of the hydrogen-containing gas supply pipe 232b. An argon (Ar) gas supply source 250c, the MFC 252c and the valve 253c are sequentially provided in that order from an upstream side to a downstream side of the inert gas supply pipe 232c.

The valve 243a is provided on a downstream side where the nitrogen-containing gas supply pipe 232a, the hydrogen-containing gas supply pipe 232b and the inert gas supply pipe 232c join.

It is possible to supply a process gas such as the nitrogen-containing gas, the hydrogen-containing gas and the inert gas into the process chamber 201 via the gas supply pipes 232a, 232b and 232c by opening and closing the valves 253a, 253b, 253c and 243a while adjusting flow rates of the respective gases by the MFCs 252a, 252b and 252c.

Plasma Generator 260

As shown in FIG. 1, the plasma generator 260 includes a high frequency power supply 273, an RF sensor 272, a matcher (which is a matching mechanism) 274, the resonance coil 212, a shield plate 223 and an electrostatic shield 400.

High Frequency Power Supply 273

The high frequency power supply 273 is configured to supply a high frequency power (also referred to as an "RF power") to the resonance coil 212. The high frequency power supply 273 includes a power supply controller (control circuit, not shown) and an amplifier (output circuit, not shown). The power supply controller includes a high frequency oscillation circuit (not shown) and a preamplifier (not shown) in order to adjust an oscillation frequency and an output. The amplifier amplifies the output to a predetermined output level. The power supply controller controls the amplifier based on output conditions relating to the frequency and the power, which are set in advance through an operation panel (not shown), and the amplifier supplies a constant high frequency power to the resonance coil 212 via a transmission line.

RF Sensor 272 and Matcher 274

The RF sensor 272 is provided at an output side of the high frequency power supply 273. The RF sensor 272 monitors information of a traveling wave or a reflected wave of the supplied high frequency power. The power of the reflected wave monitored by the RF sensor 272 is input to the matcher 274. The matcher 274 is configured to control the impedance of the high frequency power supply 273 or the output frequency of the high frequency power so as to minimize the reflected wave based on the information on the reflected wave input from the RF sensor 272.

Resonance Coil 212 and Shield Plate 223

The resonance coil 212 is wound around an outer peripheral surface 203a of the upper vessel 210 of the process vessel 203 so as to surround the outer peripheral surface 203a while being spaced apart from the outer peripheral surface 203a. The RF sensor 272, the high frequency power supply 273 and the matcher 274 configured to match (control) the impedance of the high frequency power supply 273 or the output frequency of the high frequency power are connected to the resonance coil 212.

A winding diameter, a winding pitch and the number of winding turns of the resonance coil 212 are set such that the resonance coil 212 resonates at a certain wavelength, and a standing wave is formed in the resonance coil 212 to which the high frequency power is supplied. That is, an electrical length of the resonance coil 212 is set to an integral multiple of a wavelength of a predetermined frequency of the high frequency power supplied from the high frequency power supply 273.

Specifically, considering the conditions such as the power to be applied and a magnetic field strength to be generated, an effective cross-section of the resonance coil 212 is set within a range from 50 mm$^2$ to 300 mm$^2$ and a diameter of the resonance coil 212 is set within a range from 200 mm to 500 mm such that, for example, a magnetic field of about 0.01 Gauss to about 10 Gauss can be generated by the high frequency power whose frequency is 800 kHz to 50 MHz and whose power is 0.1 KW to 5 KW. For example, the resonance coil 212 is wound twice to 60 times so as to surround the outer peripheral surface 203a of the upper vessel 210.

According to the present embodiment, for example, the frequency of the high frequency power is set to 27.12 MHz, and the electrical length of the resonance coil 212 is set to the wavelength (about 11 meters). In addition, the winding pitch of the resonance coil 212 (P1 in FIG. 4) is set to 24.5 mm, and the resonance coil 212 is wound at equal intervals.

The winding diameter (diameter) of the resonance coil 212 is set to be larger than a diameter of the wafer 200. According to the present embodiment, for example, the diameter of the wafer 200 is set to Φ 300 mm, and the winding diameter of the resonance coil 212 is set to Φ 500 mm or more, which is greater than the diameter of the wafer 200.

For example, a material such as a copper pipe, a copper thin plate and an aluminum pipe may be used as a material constituting the resonance coil 212. The resonance coil 212 is supported by a plurality of supports (not shown) made of an insulating material of a plate shape. One end of the resonance coil 212 is grounded via a movable tap 213 in order to fine-tune the electrical length of the resonance coil 212, and the other end of the resonance coil 212 is grounded via a fixed ground 214. A position of the movable tap 213 may be adjusted in order for the resonance characteristics of the resonance coil 212 to become approximately the same as those of the high frequency power supply 273.

In addition, in order to fine-tune the impedance of the resonance coil 212 when the substrate processing apparatus 100 is initially installed or when the processing conditions of the substrate processing apparatus 100 are changed, a power feeder (not shown) configured to supply the electric power to the resonance coil 212 is constituted by a movable tap 215 movably connected to the resonance coil 212.

Since the resonance coil 212 includes a variable ground (that is, the movable tap 213) and a variable power feeder (that is, the power feeder constituted by the movable tap 215), it is possible to easily adjust a resonance frequency and a load impedance of the process chamber 201.

A waveform adjustment circuit (not shown) constituted by a coil (not shown) and a shied (not shown) is inserted into at least one end of the resonance coil 212 so that the phase current and the opposite phase current flow symmetrically with respect to an electrical midpoint of the resonance coil 212. The waveform adjustment circuit is configured to be open by setting the resonance coil 212 to an electrically disconnected state or an electrically equivalent state.

The shield plate 223 is disposed so as to surround the resonance coil 212 at an upper portion and a side portion thereof. The shield plate 223 is provided to shield an electric field outside of the resonance coil 212 and to form a capacitive component (also referred to as a "C component") of the resonance coil 212 necessary for constructing a resonance circuit between the shield plate 223 and the resonance coil 212. In general, the shield plate 223 is made of a conductive material such as an aluminum alloy, and is of a cylindrical shape. Specifically, the shield plate 223 is disposed, for example, about 5 mm to 150 mm apart from an outer periphery of the resonance coil 212.

Electrostatic Shield 400

The electrostatic shield 400 is disposed between the outer peripheral surface 203a of the process vessel 203 and the resonance coil 212. The electrostatic shield 400 will be described later in detail.

Controller 221

The controller 221 serving as a control device is configured to control the components of the substrate processing apparatus 100 described above. For example, as shown in FIG. 1, the controller 221 is configured to control the APC valve 242, the valve 243b and the vacuum pump 246 via a signal line A, the susceptor elevator 268 via a signal line B, the heater power regulator 276 and the variable impedance regulator 275 via a signal line C, the gate valve 244 via a signal line D, the RF sensor 272, the high frequency power supply 273 and the matcher 274 via a signal line E, and the MFCs 252a, 252b and 252c and the valves 253a, 253b, 253c and 243a via a signal line F.

Figure 5:
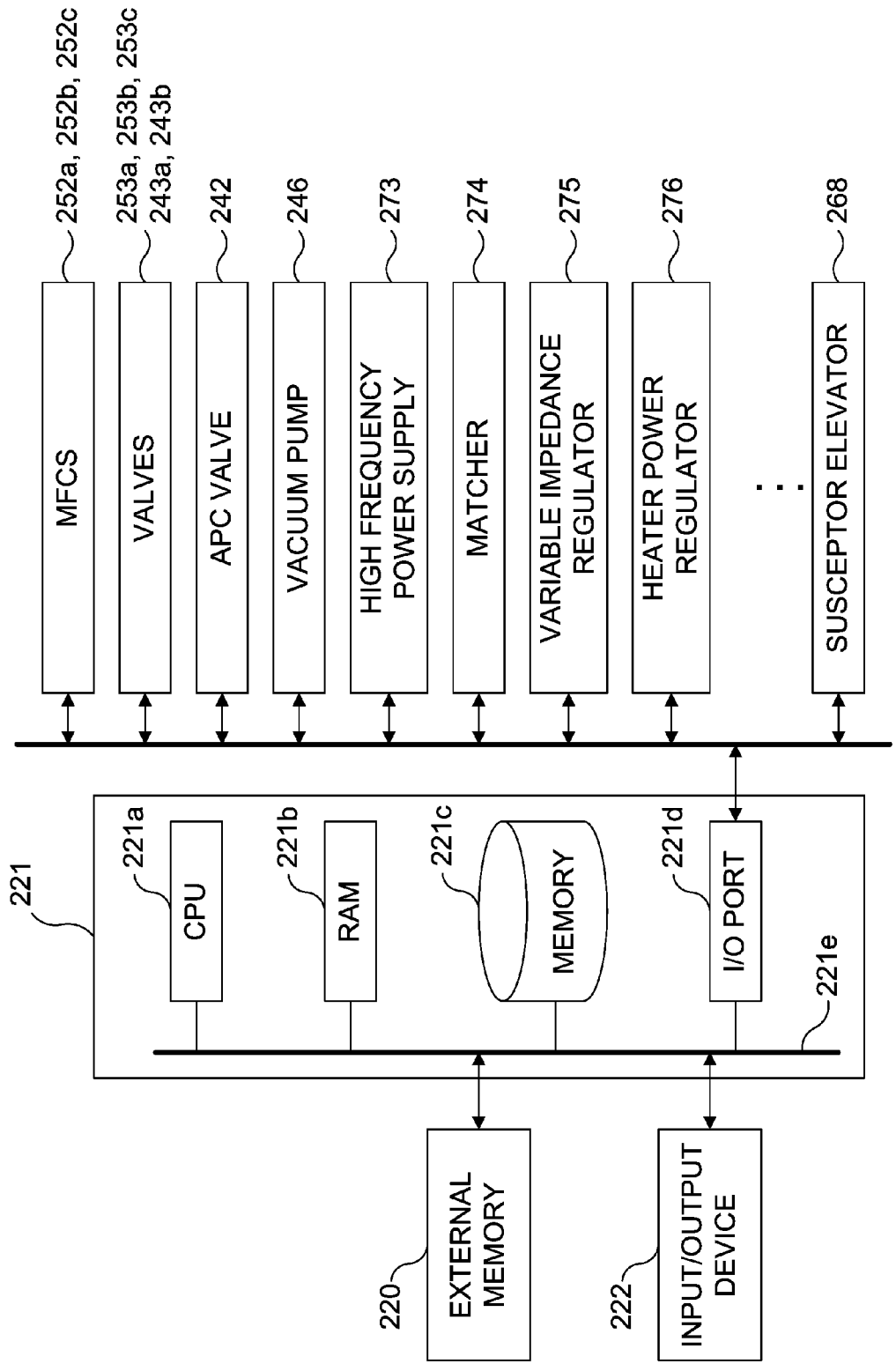
FIG. 5 is a block diagram schematically illustrating a configuration of a controller and related components of the substrate processing apparatus.

As shown in FIG. 5, the controller 221 is embodied by a computer including a CPU (Central Processing Unit) 221a, a RAM (Random Access Memory) 221b, a memory 221c and an I/O port 221d. The RAM 221b, the memory 221c and the I/O port 221d may exchange data with the CPU 221a through an internal bus 221e. For example, an input/output device 222 such as a touch panel (not shown) and a display (not shown) is connected to the controller 221.

The memory 221c may be embodied by components such as a flash memory and a HDD (Hard Disk Drive). Components such as a control program configured to control the operation of the substrate processing apparatus 100 and a process recipe in which information such as the order and the conditions of the substrate processing described later is stored are readably stored in the memory 221c.

The I/O port 221d is electrically connected to the components described above such as the MFCs 252a, 252b and 252c, the valves 253a, 253b, 253c, 243a and 243b, the gate valve 244, the APC valve 242, the vacuum pump 246, the RF sensor 272, the high frequency power supply 273, the matcher 274, the susceptor elevator 268, the variable impedance regulator 275 and the heater power regulator 276.

The CPU 221a is configured to read and execute the control program stored in the memory 221c, and to read the process recipe stored in the memory 221c in accordance with an instruction such as an operation command inputted via the input/output device 222.

In addition, the CPU 221a is configured to control the operations of the components of the substrate processing apparatus 100 in accordance with the process recipe via the I/O port 221d and the signal lines A through F described above.

The controller 221 may be embodied by preparing an external memory 220 storing the program and by installing the program onto a computer using the external memory 220. For example, the external memory 220 may include a magnetic tape, a magnetic disk such as a flexible disk and a hard disk, an optical disk such as a CD and a DVD, a magneto-optical disk such as an MO and a semiconductor memory such as a USB memory and a memory card.

The memory 221c or the external memory 220 may be embodied by a non-transitory computer readable recording medium.

Substrate Processing

Figure 6:
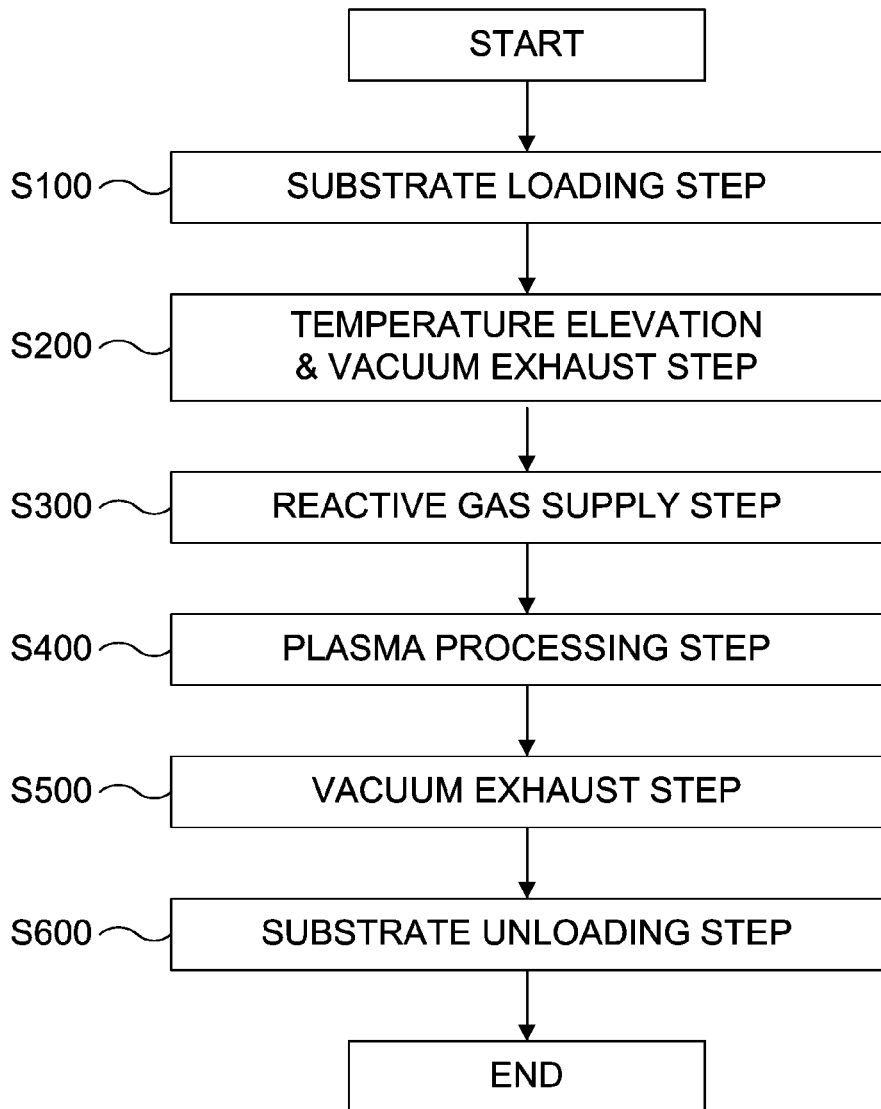
FIG. 6 is a flowchart schematically illustrating a substrate processing according to the embodiments described herein.
Figure 7:
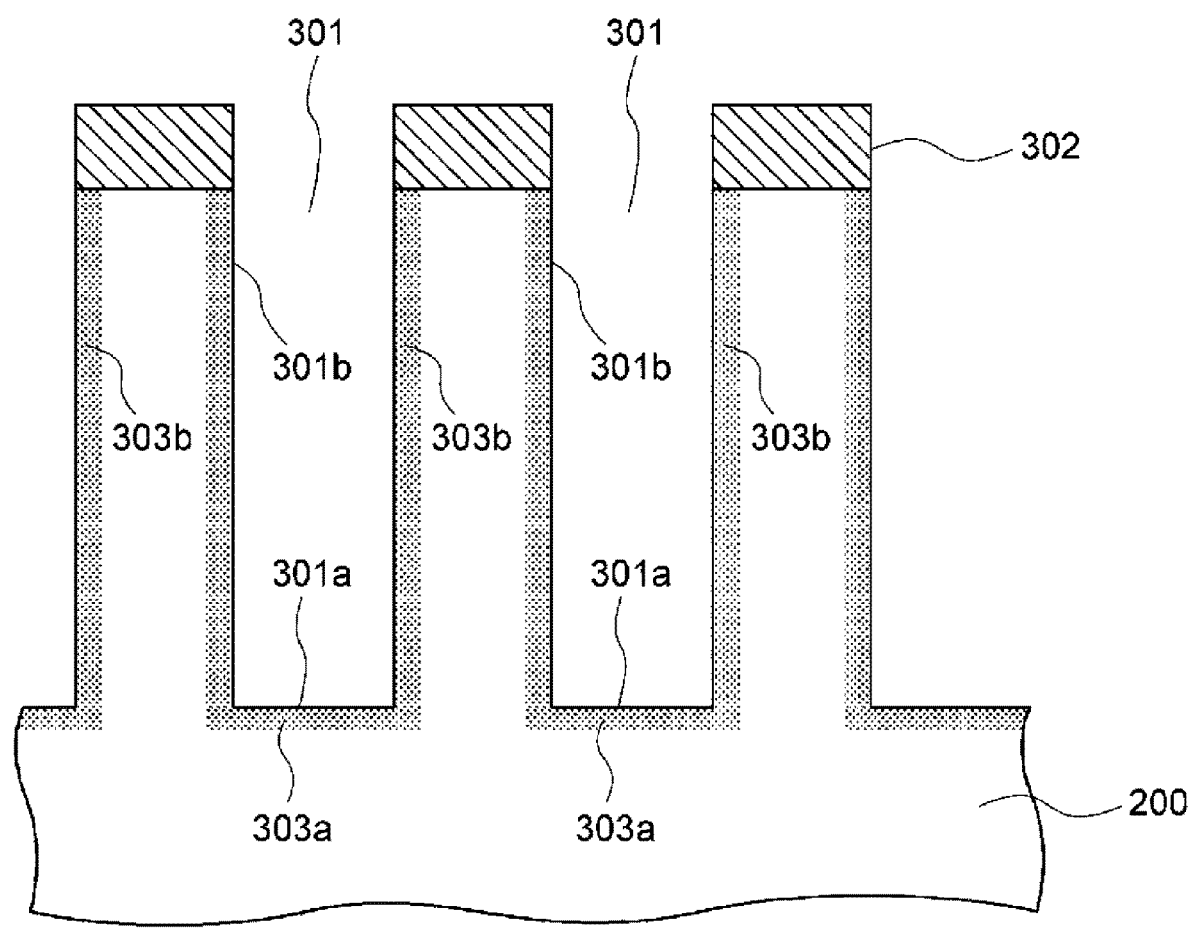
FIG. 7 schematically illustrates an example of a substrate with a groove (trench) formed thereon to be processed according to the substrate processing.

Subsequently, the substrate processing according to the present embodiment will be described with reference to a flowchart shown in FIG. 6. The controller 221 controls the operations of the components of the substrate processing apparatus 100 when performing the substrate processing. For example, as shown in FIG. 7, a trench (also referred to as a "groove") 301 whose surface is at least made of a silicon layer is formed in advance on the surface of the wafer 200 to be processed by the substrate processing according to the present embodiment. In addition, the trench 301 includes a concave-convex portion of a high aspect ratio. According to the present embodiment, for example, the nitridation process serving as the substrate processing using the plasma is performed to nitride the silicon layer exposed on an inner wall of the trench 301.

Substrate Loading Step S100

First, the wafer 200 is transferred (loaded) into the process chamber 201 (refer to FIG. 1). Specifically, the susceptor 217 is lowered to a position of transferring the wafer 200 (also referred to as a "wafer transfer position") by the susceptor elevator 268. As a result, the wafer lift pins 266 protrude from the surface of the susceptor 217 by a predetermined height.

Subsequently, the gate valve 244 is opened, and the wafer 200 is loaded into the process chamber 201 using the wafer transport device (not shown) from a vacuum transfer chamber provided adjacent to the process chamber 201. The wafer 200 loaded into the process chamber 201 is supported by the wafer lift pins 266 protruding from the surface of the susceptor 217 in a horizontal orientation. After the wafer 200 is loaded into the process chamber 201, the gate valve 244 is closed to seal the process chamber 201. Thereafter, the susceptor elevator 268 elevates the susceptor 217 until the wafer 200 is placed on an upper surface of the susceptor 217 and supported by the susceptor 217.

Temperature Elevation and Vacuum Exhaust Step S200

Subsequently, a temperature of the wafer 200 loaded into the process chamber 201 is elevated. By placing the wafer 200 on the susceptor 217 where the heater 217b is embedded, for example, the wafer 200 is heated to a predetermined temperature within a range from 150° C. to 750° C.

According to the present embodiment, for example, the predetermined temperature of the wafer 200 is 700° C. While the wafer 200 is being heated, the vacuum pump 246 vacuum-exhausts an inner atmosphere of the process chamber 201 through the gas exhaust pipe 231 such that an inner pressure of the process chamber 201 is at a predetermined pressure. The vacuum pump 246 vacuum-exhausts the inner atmosphere of the process chamber 201 at least until a substrate unloading step S600 described later is completed.

Reactive Gas Supply Step S300

Subsequently, the nitrogen ($N_2$) gas (which is the nitrogen-containing gas) and the hydrogen ($H_2$) gas (which is the hydrogen-containing gas) are supplied into the process chamber 201 as the reactive gas. Specifically, the valves 253a and 253b are opened to supply the $N_2$ gas and the $H_2$ gas into the process chamber 201 while flow rates of the $N_2$ gas and the $H_2$ gas are adjusted by the MFCs 252a and 252b, respectively. In the reactive gas supply step S300, for example, the flow rate of the $N_2$ gas is set to a predetermined flow rate within a range from 20 sccm to 5,000 sccm. In addition, for example, the flow rate of the $H_2$ gas is set to a predetermined flow rate within a range from 20 sccm to 1,000 sccm.

In the reactive gas supply step S300, the inner atmosphere of the process chamber 201 is exhausted by adjusting an opening degree of the APC valve 242 such that the inner pressure of the process chamber 201 is at a predetermined pressure within a range from 1 Pa to 250 Pa, preferably from 1 Pa to 5 Pa. The $N_2$ gas and the $H_2$ gas are continuously supplied into the process chamber 201 until a plasma processing step S400 described later is completed.

Plasma Processing Step S400

Subsequently, the high frequency power is supplied to the resonance coil 212 from the high frequency power supply 273 via the RF sensor 272. According to the present embodiment, for example, the high frequency power of 27.12 MHz is supplied from the high frequency power supply 273 to the resonance coil 212. For example, the high frequency power of 27.12 MHz supplied to the resonance coil 212 is a predetermined power within a range from 100 W to 5,000 W, preferably 100 W to 3,500 W, and more preferably about 3,500 W.

Thereby, an induction plasma is excited in the plasma generation space of the process chamber 201 to which the $N_2$ gas and the $H_2$ gas are supplied. The $N_2$ gas and the $H_2$ gas excited into the induction plasma dissociate. As a result, reactive species such as nitrogen radicals (nitrogen active species) containing nitrogen atoms, nitrogen ions, hydrogen radicals (hydrogen active species) containing hydrogen atoms and hydrogen ions may be generated. The radicals generated by the induction plasma and non-accelerated ions such as the nitrogen ions and the hydrogen ions are uniformly supplied onto the surface of the wafer 200. Then, the radicals and the ions uniformly supplied onto the surface of the wafer 200 uniformly react with the silicon layer formed on the surface of the wafer 200. Thereby, the silicon layer is modified into a silicon nitride layer (SiN layer) whose step coverage is good.

After a predetermined process time elapses (for example, 10 seconds to 300 seconds), the supply of the high frequency power from the high frequency power supply 273 is stopped to stop a plasma discharge in the process chamber 201. In addition, the valves 253a and 253b are closed to stop the supply of the $N_2$ gas and the $H_2$ gas into the process chamber 201. Thereby, the plasma processing step S400 is completed.

Vacuum Exhaust Step S500

Subsequently, the inner atmosphere of the process chamber 201 is vacuum-exhausted through the gas exhaust pipe 231. Thereafter, the opening degree of the APC valve 242 is adjusted such that the inner pressure of the process chamber 201 is adjusted to the same pressure as that of the vacuum transfer chamber (not shown).

Substrate Unloading Step S600

Subsequently, the susceptor 217 is lowered to the wafer transfer position described above until the wafer 200 is supported by the wafer lift pins 266. Then, the gate valve 244 is opened, and the wafer 200 is unloaded from the process chamber 201 to the outside of the process chamber 201 by using the wafer transport device (not shown). Thereby, the substrate processing according to the present embodiment is completed.

Main Configuration

Subsequently, a principle of generating the plasma in the plasma processing step S400, properties of the generated plasma, and the electrostatic shield 400 provided between the outer peripheral surface 203a of the process vessel 203 and the resonance coil 212 will be described.

Principle of Generating Plasma and Properties of Generated Plasma

A plasma generation circuit constituted by the resonance coil 212 shown in FIG. 1 is configured as an RLC parallel resonance circuit. When the wavelength of the high frequency power supplied from the high frequency power supply 273 and the electrical length of the resonance coil 212 are the same, a reactance component generated by a capacitance component and an inductive component of the resonance coil 212 is canceled out to become a pure resistance. However, when the plasma is generated in the plasma generation circuit described above, an actual resonance frequency may fluctuate slightly depending on conditions such as a variation (change) in a capacitive coupling between the plasma and a high voltage portion of the resonance coil 212.

Therefore, according to the present embodiment, in order to compensate for a resonance shift in the resonance coil 212 when the plasma is generated by adjusting the high frequency power supplied from the high frequency power supply 273, the matcher 274 is configured to correct the output of the high frequency power supply 273 based on the power of the reflected wave detected by the RF sensor 272. Specifically, the matcher 274 is configured to increase or decrease the impedance or the output frequency of the high frequency power supply 273 such that the power of the reflected wave is minimized based on the power of the reflected wave detected by the RF sensor 272 when the plasma is generated.

When the impedance of the high frequency power supply 273 is controlled by the matcher 274, the matcher 274 is constituted by a variable capacitor control circuit (not shown) capable of correcting a preset impedance. When the output frequency of the high frequency power supply 273 is controlled by the matcher 274, the matcher 274 is constituted by a frequency control circuit (not shown) capable of correcting a preset oscillation frequency of the high frequency power supply 273.

According to the configuration related to the resonance coil 212 described above, the high frequency power whose frequency is equal to the actual resonance frequency of the resonance coil 212 is supplied to the resonance coil 212. Therefore, the standing wave in which the phase voltage thereof and the opposite phase voltage thereof are always canceled out by each other is generated in the resonance coil 212. In addition, according to the present embodiment, the high frequency power is supplied to the resonance coil 212 to match an actual impedance of the resonance coil 212. Therefore, the standing wave in which the phase voltage thereof and the opposite phase voltage thereof are always canceled out by each other is generated in the resonance coil 212.

Specifically, when the electrical length of the resonance coil 212 is equal to a single wavelength of the high frequency power supplied from the high frequency power supply 273, a current standing wave and a voltage standing wave whose wavelengths are equal to the wavelength of the high frequency power supplied from the high frequency power supply 273 through the resonance coil 212 are generated. Among waveforms on a right portion of FIG. 4, a broken line illustrates the current and a solid line illustrates the voltage. As shown by the waveform on the right portion of FIG. 4, an amplitude of the current standing wave is maximized at both ends (a lower end and an upper end) of the resonance coil 212 and the electrical midpoint of the resonance coil 212, and is minimized at positions therebetween. In other words, an amplitude of the voltage standing wave is minimized at both ends (the lower end and the upper end) of the resonance coil 212 and the electrical midpoint of the resonance coil 212, and is maximized at the positions therebetween.

When the wavelength of the high frequency power and the electrical length of the resonance coil 212 are the same, the highest phase current is generated at the electrical midpoint of the resonance coil 212 (node with zero voltage). Therefore, a donut-shaped induction plasma (ICP component plasma described later) with extremely low electric potential is generated in the vicinity of the electrical midpoint of the resonance coil 212 and both ends of the resonance coil 212. The donut-shaped induction plasma is almost not capacitively coupled with a wall of the process chamber 201 or the susceptor 217. In particular, a density of the generated donut-shaped induction plasma is highest in the vicinity of the electrical midpoint of the resonance coil 212.

Electrostatic Shield 400

Figure 2:
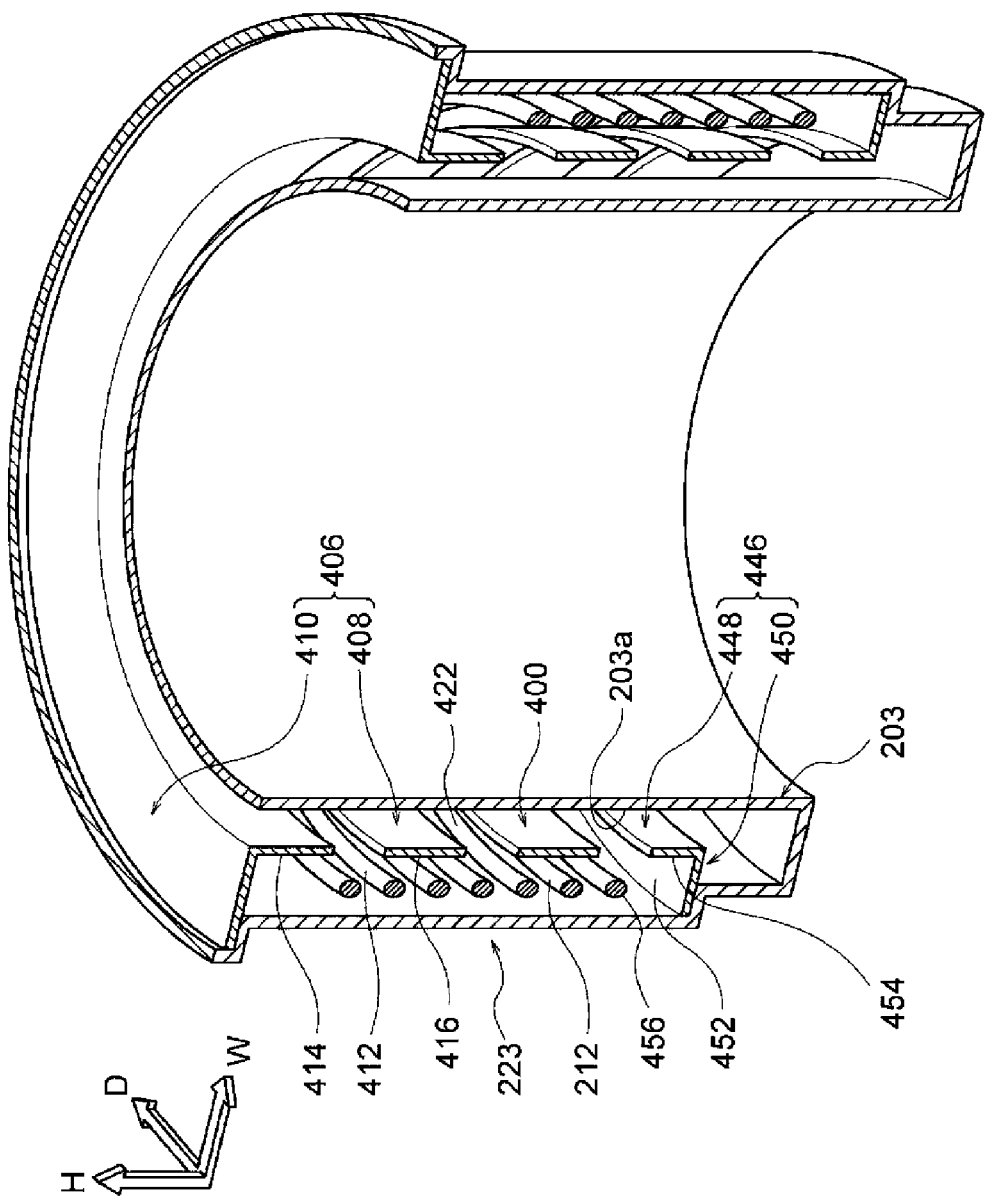
FIG. 2 is a perspective view schematically illustrating a part of the substrate processing apparatus according to the embodiments described herein.

As shown in FIGS. 1 and 2, the electrostatic shield 400 is disposed between the outer peripheral surface 203a of the process vessel 203 and the resonance coil 212. The electrostatic shield 400 is provided on a part of shield bodies 406 and 446.

First, the shield bodies 406 and 446 on which the electrostatic shield 400 is provided will be described.

Figure 3:
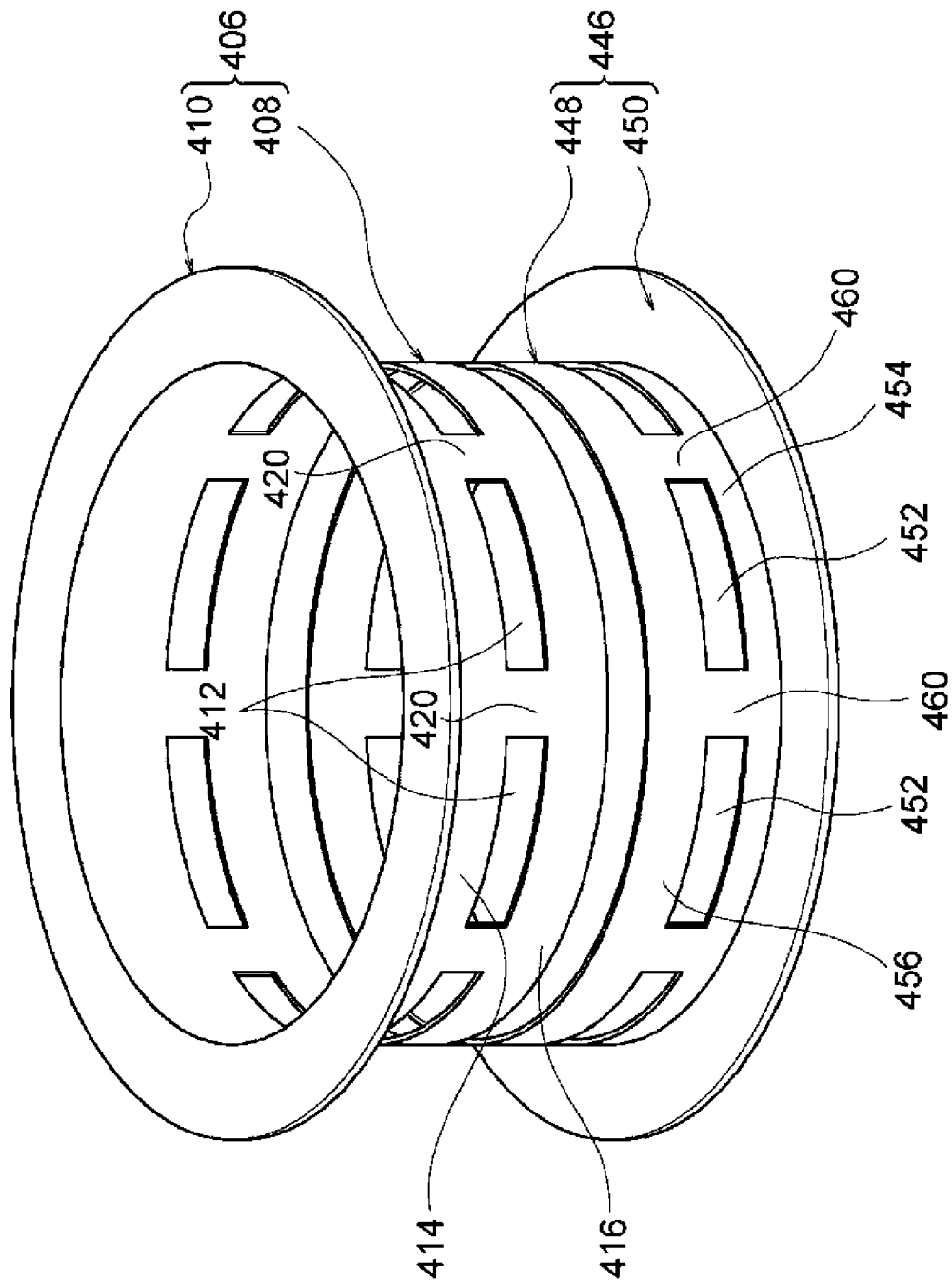
FIG. 3 is a perspective view schematically illustrating shield bodies of the substrate processing apparatus according to the embodiments described herein.

As shown in FIGS. 2 and 3, the shield body 406 and the shield body 446 are aligned in the vertical direction, and are sequentially arranged in that order from top to bottom.

For example, the shield body 406 is formed by bending an aluminum plate material whose thickness is about 2 mm. The shield body 406 includes: a side wall 408 of a cylindrical shape disposed radially outer than the outer peripheral surface 203a (refer to FIG. 1) of the process vessel 203 in reference to a radial direction of the resonance coil 212 (hereinafter, also referred to as a "coil radial direction"); and a flange 410 extending radially outward from an upper end of the side wall 408 in the coil radial direction. A tip (front end) of the flange 410 is attached to an upper end portion of the shield plate 223 by using an attacher (not shown) (refer to FIG. 2).

In addition, a plurality of openings 412 of a rectangular shape extending in a circumferential direction of the resonance coil 212 (hereinafter, also referred to as "coil circumferential direction") are provided in the side wall 408 so as to be arranged in the coil circumferential direction. Hereinafter, the plurality of the openings 412 are simply referred to as the openings 412. The openings 412 are opened between the resonance coil 212 and the outer peripheral surface 203a of the process vessel 203. A portion of the side wall 408 above the openings 412 serves as a ground 414 electrically grounded to the earth. On the other hand, a portion of the side wall 408 below the openings 412 serves as a partition 416 configured to partition between a part of the resonance coil 212 and the outer peripheral surface 203a of the process vessel 203. The partition 416 is configured to partition the part of the resonance coil 212 and the outer peripheral surface 203a of the process vessel 203 throughout an entire region in the coil circumferential direction. Thus, in an axial direction of the resonance coil 212 (hereinafter, also referred to as a "coil axial direction"), the ground 414 is arranged outside the partition 416 (further away from the shield body 446) so as to extend in the coil circumferential direction. Preferably, in order to sufficiently shield the part of the resonance coil 212 and the outer peripheral surface 203a of the process vessel 203, the partition 416 is provided throughout the entire region in the coil circumferential direction. However, as long as a desired shielding effect is obtained, additional openings may be provided at a part of the partition 416 in the coil circumferential direction.

In addition, a portion provided between the openings 412 adjacent to each other in the coil circumferential direction serves as a plurality of connectors 420 configured to connect the ground 414 and the partition 416. Hereinafter, the plurality of the connectors 420 are simply referred to as the connectors 420. The connectors 420 are provided in the coil circumferential direction so as to be spaced apart from each other. As a result, the partition 416 is grounded to the ground 414 via the connectors 420 that are electrically conductive.

The shield body 446 is provided below the shield body 406. For example, the shield body 446 is formed by bending an aluminum plate material whose thickness is about 2 mm. The shield body 446 includes: a side wall 448 of a cylindrical shape disposed radially outer than the outer peripheral surface 203a in reference to the coil radial direction; and a flange 450 extending radially outward from a lower end of the side wall 448 in the coil radial direction. A tip (front end) of the flange 450 is attached to a lower end portion of the shield plate 223 by using an attacher (not shown) (refer to FIG. 2).

In addition, a plurality of openings 452 of a rectangular shape extending in the coil circumferential direction are provided in the side wall 448 so as to be arranged in the coil circumferential direction. Hereinafter, the plurality of the openings 452 are simply referred to as the openings 452. The openings 452 are opened between the resonance coil 212 and the outer peripheral surface 203a of the process vessel 203. A portion of the side wall 448 below the openings 452 serves as a ground 454 electrically grounded to the earth. On the other hand, a portion of the side wall 448 above the openings 452 serves as a partition 456 configured to partition between the part of the resonance coil 212 and the outer peripheral surface 203a of the process vessel 203. The partition 456 is configured to partition between the part of the resonance coil 212 and the outer peripheral surface 203a of the process vessel 203 throughout an entire region in the coil circumferential direction. Thus, in reference to the coil axial direction, the ground 454 is arranged axially outer than the partition 456 (further away from the shield body 406) so as to extend in the coil circumferential direction. Similar to the partition 416, additional openings may be provided at a part of the partition 456 in the coil circumferential direction.

In addition, a portion formed between the openings 452 adjacent to each other in the coil circumferential direction serves as a plurality of connectors 460 configured to connect the ground 454 and the partition 456. Hereinafter, the plurality of the connectors 460 are simply referred to as the connectors 460. The connectors 460 are provided in the coil circumferential direction so as to be spaced apart from each other. As a result, the partition 456 is grounded to the ground 454 via the connectors 460 that are electrically conductive. That is, the partition 416 and the partition 456 are individually grounded to the ground 414 and the ground 454, respectively. According to the present embodiment, the term "individually grounded" means that the partition 416 and the partition 456 are grounded by different grounds such as the ground 414 and the ground 454.

An upper end edge of the partition 456 of the shield body 446 and a lower end edge of the partition 416 of the shield body 406 face each other in the coil axial direction (that is, the vertical direction). In addition, a space provided between the partition 456 and the partition 416 in the coil axis direction serves as an opening 422. The opening 422 is opened between the part of the resonance coil 212 and the outer peripheral surface 203a of the process vessel 203 throughout an entire region in the coil circumferential direction.

The partition and the opening are alternately arranged along in the coil axial direction. That is, for example, the openings 412, the partition 416, the opening 422, the partition 456 and the openings 452 are sequentially provided in that order along the coil axis direction to constitute the electrostatic shield 400.

Subsequently, a relative positional relationship between the electrostatic shield 400 and the resonance coil 212 will be described.

Figure 4:
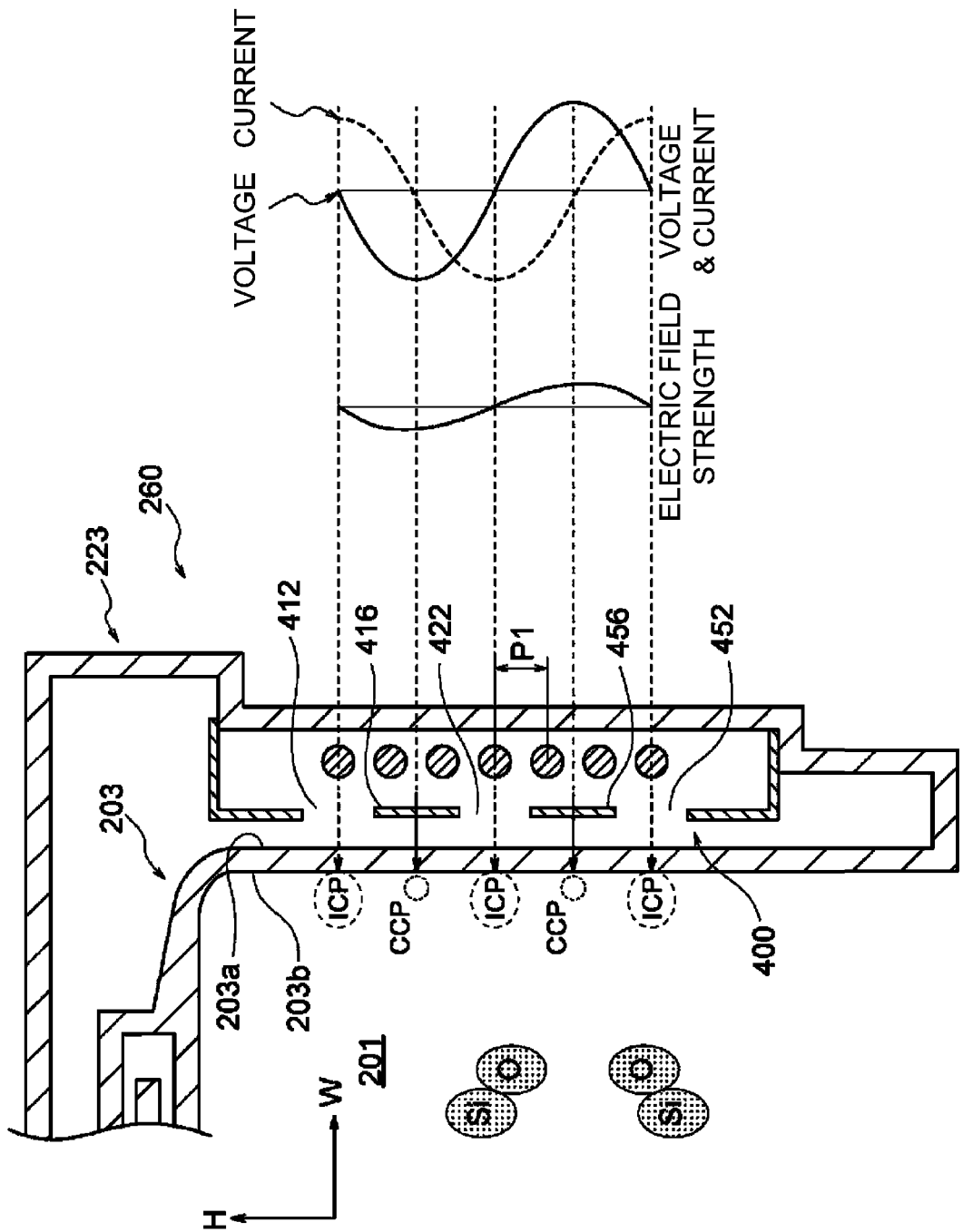
FIG. 4 is a diagram schematically illustrating a relationship among a resonance coil, an electrostatic shield, an electric field strength, a current and a voltage according to the embodiments described herein.

As shown in FIG. 4, the openings 412, the opening 422 and the openings 452 are provided between the resonance coil 212 and the outer peripheral surface 203a of the process vessel 203 where the amplitude of the voltage standing wave applied to the resonance coil 212 by the high frequency power being supplied is minimized along the coil radial direction. An opening width (opening length in the vertical direction) of each of the openings 412, the opening 422 and the openings 452 is set to 30 mm, which is wider than one pitch (24.5 mm) of the resonance coil 212.

On the other hand, the partition 416 and the partition 456 of the electrostatic shield 400 are provided between the resonance coil 212 and the outer peripheral surface 203a of the process vessel 203 where the amplitude of the voltage standing wave applied to the resonance coil 212 by the high frequency power being supplied is maximized along the coil radial direction.

Operation

Subsequently, an operation of the plasma generator 260 according to the present embodiment will be described while comparing with a plasma generator 760 according to a comparative example. First, a configuration and an operation of the plasma generator 760 according to the comparative example will be described. Portions of the plasma generator 760 different from those of the plasma generator 260 will be mainly described.

Plasma Generator 760

Figure 8:
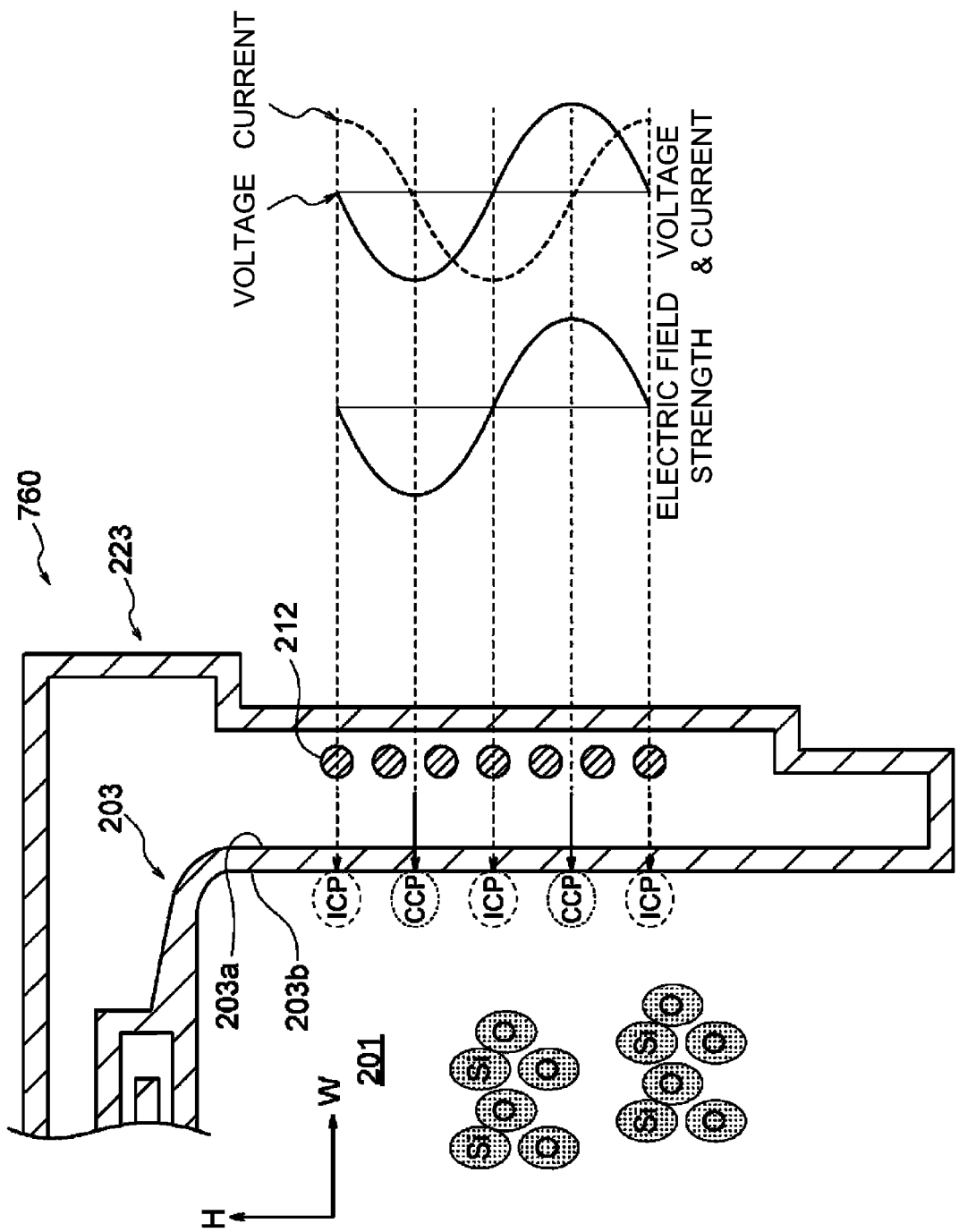
FIG. 8 is a diagram schematically illustrating a relationship among a resonance coil, an electrostatic shield, an electric field strength, a current and a voltage according to a comparative example of the embodiments described herein.

The plasma generator 760 does not include the electrostatic shield 400, as shown in a left portion of FIG. 8.

When the electrical length of the resonance coil 212 is equal to a single wavelength of the high frequency power supplied from the high frequency power supply 273 (see FIG. 1), a current standing wave and a voltage standing wave whose wavelengths are equal to the wavelength of the high frequency power supplied from the high frequency power supply 273 through the resonance coil 212 are generated. Among waveforms on a right portion of FIG. 8, a broken line illustrates the current and a solid line illustrates the voltage. As shown by the waveform on the right portion of FIG. 8, an amplitude of the current standing wave is maximized at both ends (the lower end and the upper end) of the resonance coil 212 and the electrical midpoint of the resonance coil 212, and is minimized at positions therebetween. An amplitude of the voltage standing wave is minimized at both ends (the lower end and the upper end) of the resonance coil 212 and the electrical midpoint of the resonance coil 212, and is maximized at the positions therebetween.

A high frequency magnetic field is generated around where the amplitude of the current standing wave is maximized, and the plasma discharge of the process gas supplied into the process chamber 201 is generated by a high frequency electric field induced by the high frequency magnetic field. A plasma of the process gas is generated by exciting the process gas discharged by the high frequency electric field. Hereinafter, the plasma of the process gas generated by the high frequency magnetic field generated around where the amplitude of the current is great as described above is referred to as the ICP (Inductively Coupled Plasma) component plasma. As shown in a left portion of FIG. 8, the ICP component plasma is concentratedly generated in a donut shape along an inner wall surface 203b of the process vessel 203 in regions (which are indicated by broken lines in the left portion of FIG. 8) near both ends of the resonance coil 212 and the electrical midpoint of the resonance coil 212.

On the other hand, as shown in the waveform on the right portion of FIG. 8, the amplitude of the voltage standing wave is minimized at both ends (the lower end and the upper end) of the resonance coil 212 and the electrical midpoint of the resonance coil 212, and is maximized at the positions therebetween.

In addition, a waveform on a center portion of FIG. 8 illustrates a strength of a high frequency electric field generated according to the amplitude of the voltage of the resonance coil 212. A high frequency electric field whose electric field is particularly strong is generated around where the amplitude of the voltage is maximized, and the plasma discharge of the process gas supplied into the process chamber 201 is generated by the high frequency electric field. A plasma of the process gas is generated by exciting the process gas discharged by the high frequency electric field. Hereinafter, the plasma of the process gas generated by the high frequency electric field generated around where the amplitude of the voltage is great as described above is referred to a CCP (Capacitively Coupled Plasma) component plasma. As shown in the left portion of FIG. 8, the CCP component plasma is concentratedly generated in a donut shape along the inner wall surface 203b of the process vessel 203 in regions (which are indicated by dotted lines in the left portion of FIG. 8) between the upper end of the resonance coil 212 and the electrical midpoint of the resonance coil 212 and between the lower end of the resonance coil 212 and the electrical midpoint of the resonance coil 212.

According to the comparative example, the reactive species such as radicals and ions and electrons (electric charges) are generated from the CCP component plasma. The electrons generated from the CCP component plasma are attracted to the inner wall surface 203b of the process vessel 203 by the electric field generating the CCP component plasma, and the inner wall surface 203b of the process vessel 203 is charged with the electrons (electric charges). Then, the ions generated by exciting the CCP component plasma are accelerated toward the inner wall surface 203b charged with the electrons (electric charges) and collide with inner wall surface 203b. As a result, the inner wall surface 203b of the process vessel 203 is sputtered, and components of a material (for example, quartz material) constituting the process vessel 203 are released and diffused into the process chamber 201. According to the comparative example, since the quartz material constituting the inner wall surface 203b is sputtered, components such as silicon (Si) and oxygen (O) constituting the quartz constituting quartz are released and diffused into the process chamber 201.

The released components such as silicon and oxygen may be introduced as impurities into a film such as a nitride film on the wafer 200 formed by the plasma process, and may deteriorate characteristics of the film. In addition, particles may be generated in the process chamber 201 when the inner wall surface 203b of the process vessel 203 is sputtered. When the particles adhere to a surface of the film formed on the wafer 200, the characteristics may be affected. For example, a performance or a yield of a device such as a semiconductor device may be reduced.

Plasma Generator 260

According to the plasma generator 260 of the present embodiment, as shown in the waveforms on the right portion of FIG. 4, distributions of amplitudes of the current standing wave and the voltage standing wave are the same as those of the plasma generator 760 according to the comparative example.

According to the plasma generator 260 of the present embodiment, as described above, the openings 412, the opening 422 and the openings 452 of the electrostatic shield 400 are provided between the resonance coil 212 and the outer peripheral surface 203a of the process vessel 203 where the amplitude of the voltage standing wave of the resonance coil 212 is minimized (or the amplitude of the current standing wave of the resonance coil 212 is maximized) along the coil radial direction. That is, the electrostatic shield 400 is configured to allow the influence of the electric field acting between the outer peripheral surface 203a of the process vessel 203 and the resonance coil 212 specifically where the amplitude of the voltage standing wave is minimized.

Therefore, similar to the plasma generator 760, the plasma generator 260 also generates the ICP component plasma. Specifically, as shown in a left portion of FIG. 4, the ICP component plasma is concentratedly generated in a donut shape along the inner wall surface 203b of the process vessel 203 in regions (which are indicated by broken lines in the left portion of FIG. 4) near both ends of the resonance coil 212 and the electrical midpoint of the resonance coil 212.

On the other hand, according to the plasma generator 260 of the present embodiment, as described above, the partition 416 and the partition 456 of the electrostatic shield 400 are provided between the resonance coil 212 and the outer peripheral surface 203a of the process vessel 203 where the amplitude of the voltage standing wave of the resonance coil 212 is maximized along the coil radial direction. That is, the electrostatic shield 400 is configured to limit the influence of the electric field acting between the outer peripheral surface 203a of the process vessel 203 and the resonance coil 212 specifically where the amplitude of the voltage standing wave is maximized.

As a result, as shown by a waveform on a center portion of FIG. 4, a strength of a high frequency electric field generated according to the amplitude of the voltage of the resonance coil 212 is reduced as compared with a case where the plasma generator 760 is used.

SUMMARY

As described above, according to the plasma generator 260 of the present embodiment, it is possible to reduce the strength of the high frequency electric field generated where the amplitude of the voltage is great. Therefore, it is possible to prevent the CCP component of plasma of the process gas from being generated by the high frequency electric field (refer to regions indicated by the dotted lines in the left portion of FIG. 8). Thereby, it is possible to suppress the generation of the sputtering that occurs when the ions generated by the plasma discharge are accelerated and collide with the inner wall surface 203b charged with the electrons (electric charges).

As described above, by providing the partitions 416 and 456 of the electrostatic shield 400 in the plasma generator 260, it is possible to selectively shield an undesired electric field. In addition, it is possible to provide the magnetic field in the space along the inner wall surface 203b of the process vessel 203. In addition, since a desired magnetic field generated in the space along the coil circumferential direction is not shielded by providing the openings 412, the opening 422 and the openings 452, it is possible to provide the magnetic field in the space along the inner wall surface 203b of the process vessel 203.

That is, according to the plasma generator 260 capable of selectively shielding the undesired electric field, it is possible to prevent the components of the material constituting the inner wall surface 203b from being released and diffused into the process chamber 201 as compared with the case where the plasma generator 760 is used.

In addition, it is possible to reduce amounts of the components such as silicon and oxygen released and diffused into the process chamber 201. Therefore, it is possible to prevent the components such as silicon and oxygen from being introduced as the impurities into the film such as the nitride film on the wafer 200 formed by the plasma process. As a result, it is possible to improve the characteristics of the film.

In addition, it is possible to suppress the generation of the particles in the process chamber 201 when the inner wall surface 203b is sputtered. As a result, it is possible to improve the yield of the device when the film formed on the wafer 200 is processed.

In addition, it is possible to suppress the sputtering on the inner wall surface 203b. As a result, it is possible to prevent the upper vessel 210 from being damaged.

In addition, the openings 412, the opening 422 and the openings 452 are provided wherever the amplitude of the voltage standing wave applied to the resonance coil 212 by the high frequency power being supplied is minimized. For example, when the openings 412 and the openings 452 are not provided, the efficiency of generating the ICP component plasma may be reduced. In addition, since the waveform of the electric power supplied to the resonance coil 212 may be affected, an ideal standing wave may not be generated. However, according to the present embodiment, as described above, the openings 412, the opening 422 and the openings 452 are provided wherever the amplitude of the voltage standing wave applied to the resonance coil 212 by the high frequency power being supplied is minimized. Therefore, the waveforms of the voltage and current generated in the resonance coil 212 can be made closer to ideal standing waves.

The opening width (opening length in the vertical direction) of each of the openings 412, the opening 422 and the openings 452 is set to 30 mm, which is wider than one pitch (24.5 mm) of the resonance coil 212. Therefore, as compared with a case where the opening width of each of the openings 412, the opening 422 and the openings 452 is narrower than one pitch of the resonance coil 212, it is possible to generate the high frequency magnetic field whose strength is the same throughout the entire region in the coil circumferential direction. In other words, it is possible to reduce variations in the distribution of the ICP component plasma in the coil circumferential direction.

In addition, the partition 416 and the partition 456 are provided wherever the amplitude of the voltage standing wave applied to the resonance coil 212 by the high frequency power being supplied is maximized. The partition 416 and the partition 456 are individually grounded to the ground 414 and the ground 454, respectively. Therefore, as compared with a case where the partition 416 and the partition 456 are not individually grounded, a ground resistance with respect to a shield area of the partition 416 and the partition 456 becomes small, and distances between the partitions 416 and 456 and a ground point becomes short. Therefore, it is possible to improve the shielding performance of shielding the electric field.

In addition, the partition 416 and the partition 456 are respectively connected to the ground 414 and the ground 454, disposed axially outer than the partitions 416 and 456, respectively via the connectors 420 and the connectors 460 extending in the coil axial direction. Therefore, even when the pitch of the resonance coil 212 is narrow, it is possible to ground the partition 416 and the partition 456 by connecting the partition 416 and the partition 456 to the ground 414 and the ground 454, respectively.

In addition, the partition 416 and the partition 456 are configured to partition between the resonance coil 212 and the outer peripheral surface 203a of the process vessel 203 throughout the entire region in the coil circumferential direction. Therefore, it is possible to suppress the generation of the electric field generating the CCP component plasma, as compared with a case where the partitions do not extend continuously throughout the entire region in the coil circumferential direction.

In addition, the shield body 406 and the shield body 446 are formed by bending the aluminum plate material whose thickness is about 2 mm. By using the material whose electric resistivity is low, it is possible to improve a grounding performance of the partitions 416 and 456. Thereby, it is also possible to improve the shielding performance of shielding the electric field in the partition 416 and the partition 456.

Other Embodiments

While the technique is described in detail by way of the above-described embodiment, the above-described technique is not limited thereto. It is apparent to the person skilled in the art that the above-described technique may be modified in various ways without departing from the gist thereof. For example, the above-described embodiment is described by way of an example in which the electrical length of the resonance coil 212 is equal to a single wavelength of the high frequency power supplied from the high frequency power supply 273. However, the above-described technique may be applied when the electrical length of the resonance coil 212 is equal to half the wavelength of the high frequency power supplied from the high frequency power supply 273. That is, the above-described technique may be applied when the wavelength of the high frequency power applied to the resonance coil 212 may be approximately equal to twice the electrical length of the resonance coil 212.

When the electrical length of the resonance coil 212 is equal to half the wavelength of the high frequency power supplied from the high frequency power supply 273, for example, the high frequency power supply 273 is controlled so that the amplitude of the voltage standing wave is minimized at the electrical midpoint of the resonance coil 212 and the amplitude of the voltage standing wave is maximized at both ends (the lower end and the upper end) of the resonance coil 212. Then, the partitions are provided to respectively face both ends of the resonance coil 212 where the amplitude of the voltage standing wave is maximized, and the openings are provided between the partitions to face the electrical midpoint of the resonance coil 212 where the amplitude of the current standing wave is maximized.

Alternatively, for example, the high frequency power supply 273 is controlled so that the amplitude of the voltage standing wave is minimized at both ends of the resonance coil 212 and the amplitude of the voltage standing wave is maximized at the electrical midpoint of the resonance coil 212. Then, the partitions are provided to face the electrical midpoint of the resonance coil 212 where the amplitude of the voltage standing wave is maximized, and the openings are provided above and below the partitions to respectively face both ends of the resonance coil 212 where the amplitude of the current standing wave is maximized.

For example, the above-described technique may be applied when the electrical length of the resonance coil 212 may be equal to an integral multiple of a natural number greater than or equal to 2 of the wavelength of the high frequency power supplied from the high frequency power supply 273. That is, for example, the above-described technique may be applied when the wavelength of the high frequency power applied to the resonance coil 212 may be approximately equal to ½ or ⅓ of the electrical length of the resonance coil. Similar to the above-described embodiment, the partitions are provided to face the resonance coil 212 where the amplitude of the voltage standing wave is maximized, and the openings are provided to face the resonance coil 212 where the amplitude of the voltage standing wave is minimized.

According to some embodiments in the present disclosure, it is possible to suppress the generation of the sputtering on the inner peripheral surface of the process vessel when the process gas is excited into the plasma in the process vessel.

What is claimed is:

1. A substrate processing apparatus comprising:
   a process vessel in which a process chamber is provided, wherein a process gas is excited into plasma in the process chamber;
   a gas supplier configured to supply the process gas into the process chamber;
   a coil wound around an outer peripheral surface of the process vessel while being spaced apart from the outer peripheral surface, and wherein a high frequency power is supplied to the coil; and
   an electrostatic shield disposed between the outer peripheral surface of the process vessel and the coil, wherein the electrostatic shield comprises:
   a partition extending in a circumferential direction of the coil and configured to partition between a part of the coil and the outer peripheral surface of the process vessel; and
   an opening extending in the circumferential direction of the coil and opened between another part of the coil and the outer peripheral surface of the process vessel.

2. The substrate processing apparatus of claim 1, wherein the partition is provided where an amplitude of a voltage standing wave applied to the coil by the high frequency power being supplied is maximized.

3. The substrate processing apparatus of claim 2, wherein, in an axial direction of the coil, the opening is provided between a pair of partitions comprising the partition.

4. The substrate processing apparatus of claim 2, wherein the opening is provided where the amplitude of the voltage standing wave is minimized.

5. The substrate processing apparatus of claim 4, wherein at least one of a plurality of openings comprising the opening is opened between the coil and the outer peripheral surface of the process vessel throughout an entire region in the circumferential direction of the coil.

6. The substrate processing apparatus of claim 3, wherein an opening width of the opening defined in the axial direction of the coil is equal to or greater than a single pitch of the coil.

7. The substrate processing apparatus of claim 2, wherein a plurality of partitions comprising the partition and the opening are alternately arranged along the axial direction of the coil, and
   wherein each of the plurality of the partitions is individually grounded.

8. The substrate processing apparatus of claim 7, wherein a pair of partitions among the plurality of the partitions are spaced apart from each other in the axial direction of the coil, a pair of grounds electrically grounded are provided in a manner respectively corresponding to the pair of the partitions so as to extend in the circumferential direction of the coil, one of the pair of the partitions being connected to one of the pair of the grounds via one of a pair of conductive connectors, and the other of the pair of the partitions being connected to the other of the pair of the grounds via the other of the pair of the conductive connectors.

9. The substrate processing apparatus of claim 2, wherein the partition is configured to partition between the coil and the outer peripheral surface of the process vessel over an entire region in the circumferential direction of the coil.

10. A substrate processing apparatus comprising:
    a process vessel in which a process chamber is provided, wherein a process gas is excited into plasma in the process chamber;
    a gas supplier configured to supply the process gas into the process chamber;
    a coil wound around an outer peripheral surface of the process vessel while being spaced apart from the outer peripheral surface, wherein high frequency power is supplied to the coil; and
    an electrostatic shield configured to limit an influence of the electric field acting between the outer peripheral surface of the process vessel and the coil specifically where an amplitude of a voltage standing wave applied to the coil is maximized and to allow the influence of the electric field acting between the outer peripheral surface of the process vessel and the coil specifically where the amplitude of the voltage standing wave applied to the coil is minimized.

11. A method of manufacturing a semiconductor device comprising:
- (a) loading a substrate into a process chamber provided in a process vessel;
- (b) supplying a process gas to the process chamber;
- (c) plasma-exciting the process gas supplied into the process chamber by supplying a high frequency power to a coil wound around an outer peripheral surface of the process vessel while being spaced apart from the outer peripheral surface; and
- (d) processing the substrate by the process gas plasma-excited, wherein an electrostatic shield disposed between the outer peripheral surface of the process vessel and the coil is used in (c), the electrostatic shield comprising:
- a partition extending in a circumferential direction of the coil and configured to partition between a part of the coil and the outer peripheral surface of the process vessel; and
- an opening extending in the circumferential direction of the coil and opened between another part of the coil and the outer peripheral surface of the process vessel.

12. The method of claim 11, wherein the partition of the electrostatic shield used in (c) is provided where an amplitude of a voltage standing wave applied to the coil by the high frequency power being supplied is maximized.

13. The method of claim 12, wherein the opening of the electrostatic shield used in (c) is provided at a position where the amplitude of the voltage standing wave applied to the coil by the high frequency power being supplied is minimized.

* * * * *